United States Patent
Erturk et al.

(10) Patent No.: US 7,265,979 B2
(45) Date of Patent: Sep. 4, 2007

(54) COOLING INTEGRATED CIRCUITS USING A COLD PLATE WITH TWO PHASE THIN FILM EVAPORATION

(75) Inventors: Hakan Erturk, Phoenix, AZ (US); Ioan Sauciuc, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 330 days.

(21) Appl. No.: 10/876,399

(22) Filed: Jun. 24, 2004

(65) Prior Publication Data

US 2005/0286227 A1    Dec. 29, 2005

(51) Int. Cl.
*H05K 7/20* (2006.01)
*H01L 23/473* (2006.01)

(52) U.S. Cl. .............. 361/702; 361/700; 361/701; 361/710; 361/711; 361/718; 257/713; 257/714

(58) Field of Classification Search ........ 361/701–703, 361/709–711, 718, 719; 257/706, 707, 713, 257/714
See application file for complete search history.

(56) References Cited

U.S. PATENT DOCUMENTS

| | | | | |
|---|---|---|---|---|
| 3,561,525 A | * | 2/1971 | Baer ................. | 165/104.22 |
| 3,980,133 A | * | 9/1976 | Mitsuoka et al. ...... | 165/104.21 |
| 2002/0195242 A1 | * | 12/2002 | Garner ................. | 165/274 |
| 2004/0234378 A1 | * | 11/2004 | Lovette et al. ......... | 417/48 |
| 2005/0205241 A1 | * | 9/2005 | Goodson et al. ....... | 165/80.4 |

FOREIGN PATENT DOCUMENTS

JP    01121689 A  *  5/1989  ............ 165/104

\* cited by examiner

*Primary Examiner*—Anatoly Vortman
(74) *Attorney, Agent, or Firm*—Trop, Pruner & Hu, P.C.

(57) ABSTRACT

A microchannel cold plate for cooling semiconductor electronic devices which may include a semi-permeable wall in contact with liquid in the cooling passage. The cold plate, in turn, may be in contact with the integrated circuit. Cooling liquid passes through the cold plate where it starts boiling inside of the microchannels. The wall allows gas bubbles to pass through while preventing the passage of liquid. As a result, the gas bubbles may be removed from the liquid flow by upward buoyancy. The removal of the gas bubbles improves the operation of the cold plate in some embodiments.

18 Claims, 2 Drawing Sheets

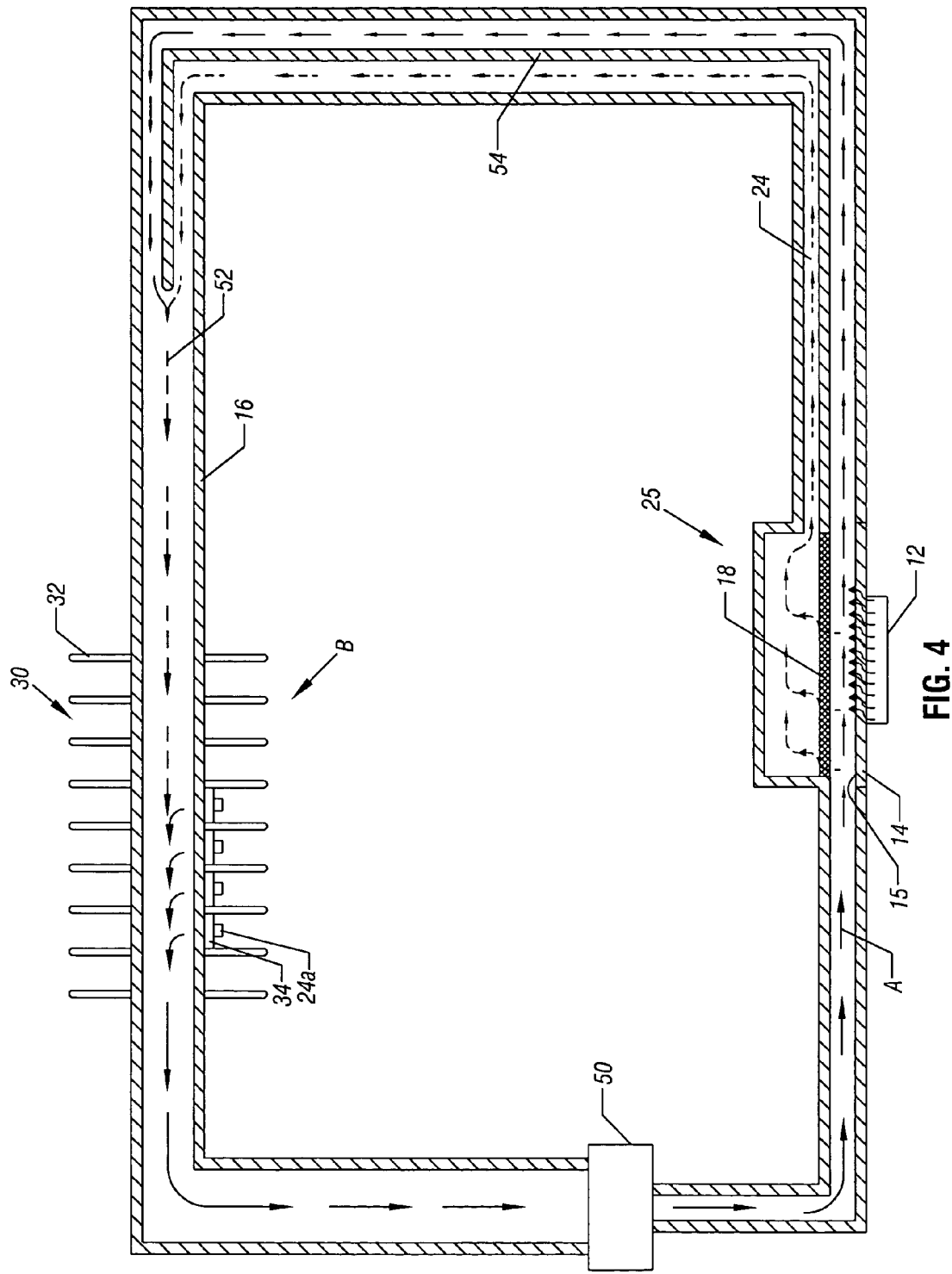

COOLING INTEGRATED CIRCUITS USING A COLD PLATE WITH TWO PHASE THIN FILM EVAPORATION

BACKGROUND

This invention relates generally to cooling integrated circuit chips.

Integrated circuit chips may be cooled by passing a flow of cooling fluid through a cold plate in sufficiently close proximity to remove heat from a heated integrated circuit. Removing the heat is desirable to improve the performance of the circuit, and to prevent damage to the circuit and surrounding components.

In some cases, a condition called dry out may occur in such devices. The dry out is a result of boiling of the cooling fluid and the formation of relatively large concentration of bubbles that interfere with heat transfer to the cooling fluid. This interference reduces the efficiency of heat transfer to the cooling fluid.

Thus, there is a need for alternative ways for cooling integrated circuits, especially for early removal of the vapor bubbles from the flow.

BRIEF DESCRIPTION OF THE DRAWINGS

FIG. 4 is an enlarged, cross-sectional view of one embodiment of the present invention.

DETAILED DESCRIPTION

Figure 1:
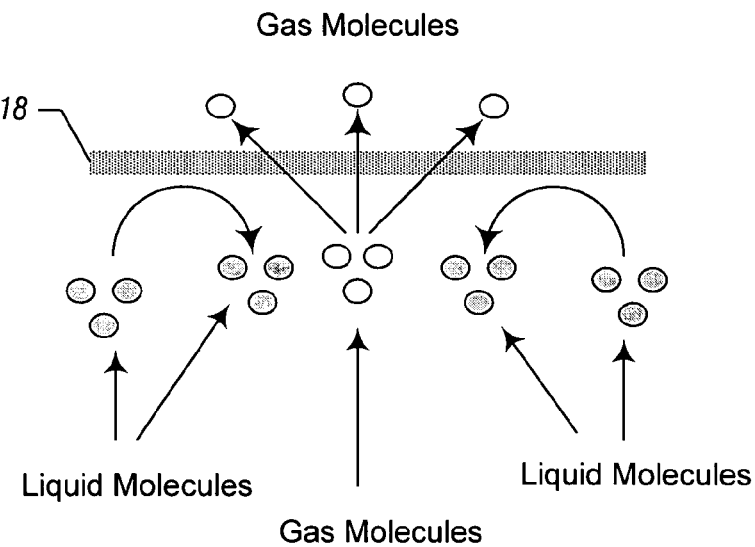
FIG. 1 is a schematic depiction of one embodiment of the present invention.

Referring to FIG. 1, a two-phase cooling fluid may be positioned below a semi-permeable membrane or wall 18. Below the cooling liquid may be a heat source in the form of a packaged integrated circuit chip (not shown). As the chip is operated, it develops heat which causes the liquid molecules to transition to a gas phase. The gas molecules may move upwardly through the semi-permeable wall 18. Because the wall is semi-permeable, the wall 18 allows the passage of gas molecules and prevents the passage of liquid. The gas molecules may then be exhausted for condensing while the liquid may continue for recycling.

As a result, the gas bubbles are removed from the flow of cooling liquid beneath the semi-permeable wall 18. Such gas bubbles can cause a partial dry out as a result of gas blockage of liquid flow.

Figure 2:
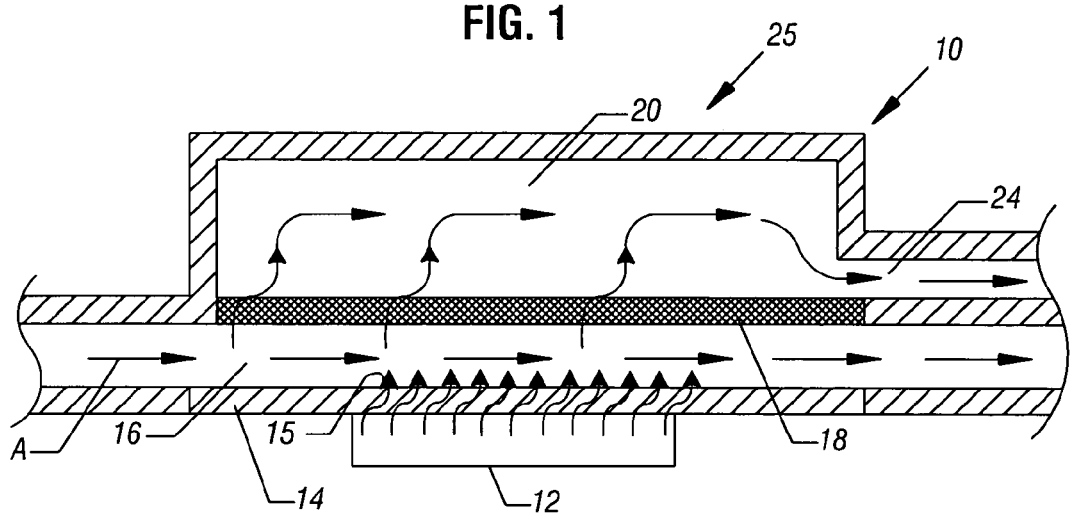
FIG. 2 is an enlarged, partial, cross-sectional view of one embodiment of the present invention.

Referring to FIG. 2, a package 12, containing a semiconductor integrated circuit, may be mounted on a cold plate 14. In one embodiment, the cold plate may include microchannels 56 (shown in FIG. 3), defined by upstanding plates 58, on its upwardly facing surface 15. A flow of liquid refrigerant, indicated by arrows A, is provided through a passage 16. Along the passage 16 may be a housing 25, including a semi-permeable wall 18.

Thus, a thin liquid flow passage 16 is provided between the housing 25 and the cold plate 14. The liquid in that passage may be thin enough to produce thin film evaporation. In one embodiment, the passage 16 may be on the order of millimeters to less than a millimeter.

The semi-permeable wall 18 may have a downwardly facing horizontal surface to receive bubbles from below. Effective cooling may occur because the gas bubbles may be exhausted into the housing 25 through the wall 18. The flow passage 24 totally separates the vapor captured above the semi-permeable wall from the two-phase mixture below. The gas bubbles may be exhausted to a flow passage 24 and the liquid may continue in the flow passage 16. In one embodiment, the gas molecules may be condensed to form liquid and re-circulate in a loop to continue to cool the package. In some embodiments, a pump may be provided in the flow passage 16 to pump the liquid.

The cold plate 14 with microchannels removes heat more efficiently in some embodiments of the present invention due to the use of the semi-permeable wall 18. This is because less vapor is in contact with the boiling surface which prevents partial dry out since the vapors can move upwardly and out of the way of the liquid flow.

Without the semi-permeable wall 18, nucleation may occur at the heat transfer surface. The nucleation or bubbles may reduce the amount of liquid contact with the heat transfer surface. The generation of bubbles on the surface may act as an insulation layer. In addition, the bubbles may tend to build up due to a choking effect. When the bubble concentration becomes high enough, the bubbles tend to remain on the liquid transfer surface. Of course, more powerful pumps may be used to pump the liquid to reduce the effect of choking, but larger pumps mean larger package volumes which may be unacceptable in some applications.

By efficiently removing the bubbles using the semi-permeable wall 18, the bubbles are less prone to choking and move upwardly through the liquid passage. This may translate into improved heat transfer.

Due to the randomness in the bubble formation and size, the buoyancy force acting on each bubble may vary accordingly. Depending on the magnitude of this force and the design of the semi-permeable wall 18, the bubbles may either penetrate through the wall 18 or may be entrained in the liquid flow. Due to the lower vapor quality, the two phase flow pressure drop decreases which, in turn, further decreases the thermal resistance.

In some embodiments, thin film evaporation improves heat transfer coefficients. By positioning the membrane wall 18 close to the boiling surface, low liquid film thickness can be achieved in some embodiments. Boiling at low vapor quality may be a preferred heat transfer regime, in some cases, due to the fact that less vapor will be in contact with the boiling surface. Thus, a continuing wetting surface may be provided.

A number of different semi-permeable membrane walls 18 may be utilized, including the GORE™ membrane vent material available from W.L. Gore & Associates of Elkton, Maryland. This material is an expanded polytetrafluoroethylene (PTFE) membrane.

In some cases, the vapor inside the housing 25 may be removed separately from the liquid flow, as illustrated in FIG. 2, and in other cases, the vapor may be intermixed with liquid. In some cases, a vacuum may be applied to the housing 25 and in other cases no such vacuum may be applied.

Figure 3:
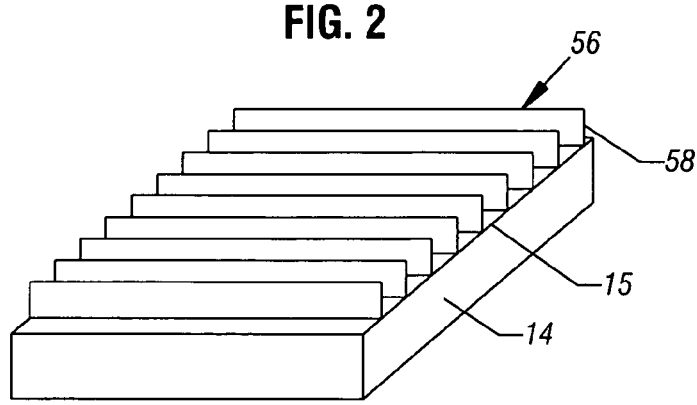
FIG. 3 is a greatly enlarged perspective view of the cooling plate shown in FIG. 2 in accordance with one embodiment of the present invention.

Referring to FIG. 3, a heat exchanger or condenser 30 may be utilized in conjunction with the cold plate 14 to subsequently cool the two-phase mixture or 100% vapor flow which was heated by heat from the integrated circuit 12. To this end, a forced airflow may be passed over the hotter two-phase fluid flow to extract the heat from or reduce the temperature of the two-phase fluid to enable the resulting liquid flow to be re-circulated. Heat radiating fins 32 may be utilized in an embodiment with forced air or unforced air cooling. While a forced airflow system is illustrated, other heat transfer techniques may also be utilized.

In the initial region B of heat transfer between the airflow and the cooling liquid, the cooling liquid is hotter than the ambient air. As the two-phase fluid is cooled by the passing airflow, the heat transfer efficiency is reduced because of the decreased temperature difference between the airflow and the hotter cooling liquid. However, in the two-phase fluid flow, a change of phase occurs at constant temperature. Thus, the heat exchange efficiency may be the same in all areas depending on final arrangement and air flow direction.

Thus, in one embodiment, the vapor drawn out of the housing 25 may be mixed with the cooling liquid before entering the condenser 30 (see FIG. 4). This may be done in a mixing area before entering the condenser.

In one embodiment, a semi-permeable membrane 34 is provided over openings in the cooling passage 16. Thus, the hot gas from the housing 25 and/or passage 24 may be ducted via ducts 24*a* into the cooling liquid to effectively increase the temperature difference in the condenser 30 between the airflow and the liquid being cooled. The membrane 34 allows the gas to pass, but prevents liquid from the passage 16 from exiting. The membrane 34 may be the same type of material used in the housing 25 for the semi-permeable wall 18 in one embodiment of the present invention.

The gas phase (indicated by dashed lines) from the passage 24 may be mixed with liquid phase from the passage 16 at 52. The two phases may be separated prior to the mixing area 52, by the wall 54. A two phase mixture may result (indicated by dashed arrows) which passes through the condenser 30. A pump 50 may be provided downstream of the condenser 50 to pump the liquid (solid arrows) exiting from the condenser 30.

A cold plate comprising: a fluid flow passage; and a chamber formed in said passage proximate to said cold plate, said chamber including a semi-permeable wall to allow gas to pass and to prevent the passage of liquid.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A cold plate assembly comprising:
   a liquid flow passage;
   a cold plate along said passage; and
   a chamber, said chamber including a semi-permeable wall to allow gas generated at said cold plate to pass from said passage and to prevent the passage of liquid from said passage through said wall, said wall fanned directly opposing said cold plate.

2. The cold plate assembly of claim 1 including microchannels in the cold plate.

3. The cold plate assembly of claim 1 wherein said chamber extends into said flow passage.

4. The cold plate assembly of claim 3 wherein gas from within said chamber is output through a separate passage from said fluid flow passage.

5. The cold plate assembly of claim 1 having an integrated circuit attached to said cold plate.

6. The cold plate assembly of claim 5 wherein said chamber is positioned over said integrated circuit.

7. The cold plate assembly of claim 1 wherein said passage narrows at said chamber.

8. A method comprising:
   removing heat from an integrated circuit using a cooling liquid flowing over a cold plate;
   transferring the heat from the cooling liquid in a heat exchanger; and
   separating gas from said cooling liquid flowing over said cold plate before said cooling liquid reaches said heat exchanger.

9. The method of claim 8 including providing a semi-permeable membrane that passes gas and blocks the flow of liquid through said membrane to separate gas from cooling liquid.

10. The method of claim 8 including providing a chamber in said cooling liquid over said integrated circuit.

11. The method of claim 8 including narrowing the flow of cooling liquid at a region and removing gas bubbles at said region.

12. A device comprising:
    an integrated circuit chip;
    a cold plate thermally coupled to said chip;
    a flow passage for the flow of cooling fluid over said cold plate;
    a chamber formed in said passage having a membrane to allow gas to pass and to prevent the passage of liquid;
    a heat exchanger along said flow passage; and
    said chamber positioned along said flow passage before said heater exchanger so that the cooling fluid passes said chamber and then said heat exchanger, and said gas is removed from said passage by said membrane at a point prior to the cooling fluid reaching said heat exchanger.

13. The device of claim 12 wherein the chamber has a semi-permeable wall farmed therein, said wall to allow gas to pass and to prevent the passage of liquid.

14. The device of claim 13 wherein said wall is arranged over said integrated circuit.

15. The device of claim 14 wherein said chamber is contained within said flow passage.

16. An electronic device comprising:
    an integrated circuit;
    a cold plate thermally coupled to said circuit;
    a flow passage for the flow of cooling fluid over said plate;
    a chamber formed in said passage, said chamber having a semi-permeable wall to allow gas to pass and to prevent the passage of cooling liquid;
    a condenser coupled to said flow passage, said condenser receiving the gas from said chamber.

17. The device of claim 16 wherein said condenser includes a region having fins to transfer heat to the atmosphere.

18. The device of claim 16 wherein said passage is thin enough to produce thin film evaporation.

* * * * *

UNITED STATES PATENT AND TRADEMARK OFFICE
CERTIFICATE OF CORRECTION

PATENT NO. : 7,265,979 B2 Page 1 of 1
APPLICATION NO. : 10/876399
DATED : September 4, 2007
INVENTOR(S) : Hakan Erturk and Ioan Sauciuc It is certified that error appears in the above-identified patent and that said Letters Patent is hereby corrected as shown below:

Column 3: Line 54 Claim 1, "fanned" should be --formed--.

Signed and Sealed this

Twenty-fifth Day of December, 2007

JON W. DUDAS
*Director of the United States Patent and Trademark Office*